United States Patent
Chowdhury et al.

(10) Patent No.: US 7,622,382 B2
(45) Date of Patent: Nov. 24, 2009

(54) FILLING NARROW AND HIGH ASPECT RATIO OPENINGS WITH ELECTROLESS DEPOSITION

(75) Inventors: Shaestagir Chowdhury, Beaverton, OR (US); Chi-Hwa Tsang, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 293 days.

(21) Appl. No.: 11/393,282

(22) Filed: Mar. 29, 2006

(65) Prior Publication Data

US 2007/0232044 A1    Oct. 4, 2007

(51) Int. Cl.
*H01L 21/4763* (2006.01)
(52) U.S. Cl. .................. 438/637; 438/639
(58) Field of Classification Search .......... 438/638, 438/639
See application file for complete search history.

(56) References Cited

U.S. PATENT DOCUMENTS

| | | | |
|---|---|---|---|
| 4,851,895 A | 7/1989 | Green et al. | |
| 5,891,513 A | 4/1999 | Dublin et al. | |
| 6,027,630 A | 2/2000 | Cohen | |
| 6,048,445 A | 4/2000 | Brain | |
| 6,103,624 A | 8/2000 | Nogami et al. | |
| 6,221,763 B1 | 4/2001 | Gilton et al. | |
| 6,242,349 B1 | 6/2001 | Nogami et al. | |
| 6,355,153 B1 | 3/2002 | Uzoh et al. | |
| 6,461,675 B2 | 10/2002 | Paranjpe et al. | |
| 6,498,397 B1 | 12/2002 | Achuthan et al. | |
| 6,554,914 B1 | 4/2003 | Rozbicki et al. | |
| 6,565,729 B2 | 5/2003 | Chen et al. | |
| 7,220,296 B1 * | 5/2007 | Chowdhury et al. | 106/1.23 |
| 2002/0011176 A1 * | 1/2002 | Yoshida et al. | 106/1.23 |
| 2002/0076929 A1 | 6/2002 | Lu et al. | |

OTHER PUBLICATIONS

Wang, Zenglin "Highly Adhesive Electroless Cu Layer Formation Using an Ultra Thin Ionized Cluster Beam (ICB)-Pd Catalytic Layer for Sub-100nm Cu Interconnections" Jpn. J. Appl. Phys. vol. 42 (2003) pp. L1223-1225.*

* cited by examiner

*Primary Examiner*—Evan Pert
*Assistant Examiner*—Grant S Withers
(74) *Attorney, Agent, or Firm*—Blakely, Sokoloff, Taylor & Zafman LLP

(57) ABSTRACT

Methods of fabricating an interconnect utilizing an electroless deposition technique, which fundamentally comprises providing a dielectric material layer having an opening extending into the dielectric material from a first surface thereof, and electrolessly depositing a conductive material within the opening. A dual-function barrier layer is formed within the opening. The dual-function barrier layer is capable of acting as a diffusion barrier layer and a nucleation surface for a conductive material. An electrolessly deposited conductive material is formed immediately above the dual-function barrier layer. An ultra-thin seed layer may be formed immediately on top of the barrier layer prior to the electrolessly deposited conductive material being formed thereon.

11 Claims, 8 Drawing Sheets

FILLING NARROW AND HIGH ASPECT RATIO OPENINGS WITH ELECTROLESS DEPOSITION

BACKGROUND

1. Field

Embodiments of the present invention relate to the fabrication of interconnect structures in microelectronic devices. In particular, embodiments of the present invention relate to utilizing electroless deposition to fill narrow and high aspect ratio openings formed in dielectric layers during the fabrication of interconnect structures.

2. State of the Art

The fabrication of microelectronic devices involves forming electronic components on microelectronic substrates, such as silicon wafers. These electronic components may include transistors, resistors, capacitors, and the like, with intermediate and overlying metallization patterns at varying levels, separated by dielectric materials, which interconnect the electrical components to form integrated circuits. The metallization patterns are generally referred to as "interconnects".

One process used to form interconnects is known as a "damascene process". In a typical damascene process, a photoresist material is patterned on a dielectric material and the dielectric material is etched through the photoresist material patterning to form a hole or a trench (hereinafter collectively referred to as "an opening" or "openings"). The photoresist material is then removed (typically by an oxygen plasma) and the opening is then filled with a conductive material (e.g., such as a metal or metal alloys). The filling of the opening may be accomplished by either physical vapor deposition, chemical vapor deposition, or electroplating, as will be understood to those skilled in the art.

A barrier layer is typically disposed on the dielectric material within the opening to prevent diffusion of the conductive material. For example, as known, copper is one preferred conductive material. Copper diffuses quickly and easily into adjacent layer, thus, a diffusion barrier layer is needed to prevent such diffusion. Additionally, a seed layer is disposed on the barrier layer. The seed layer acts as an nucleation substrate for a conductive material to form thereon The resulting structure is planarized, usually by a technique called chemical mechanical polish (CMP) or by an etching process, which removes the conductive material, which is not within the opening, from the surface of the dielectric material, to form the interconnect. As is understood by those skilled in the art, a variety of vias and trenches may be formed in the various dielectric material layers to electrically connect to one another and/or to various electronic components. In another damascene process, known as a "dual damascene process", trenches and vias are substantially simultaneously filled with the conductive material with a single deposition.

As the density of integrated circuits within microelectronic devices continues to increase with each successive technology generation, the interconnects become smaller and their aspect ratios (i.e., the ratio of depth to width) may increase. As shown in FIGS. 1-2, a problem with small size and/or high aspect ratios is that a conductive material 402 can build up at an opening 404 proximate a first surface 406 of a dielectric material 408 (i.e., the "mouth" 412 of the opening 404) during deposition. A barrier layer 410 is also present, as will be understood to those skilled in the art.

The build-up (illustrated within dashed circle 414) blocks the path of the deposited conductive material 402 deposition and, as shown in FIG. 3, often can result in voids 416 forming within the conductive material 402 in the opening 404 (shown in FIGS. 1-2). FIG. 3 illustrates an interconnect 418 formed after the conductive material 402. The voids 416 can have different sizes, distributions, and locations within the interconnect 418. For example, some voids 416 may be so large that they effectively break the conductive path of the interconnect 418, which may result in the failure of the microelectronic device, thereby having an immediate impact on yield and reliability. Additionally, the voids 416 may also be small, which may have an immediate impact by restricting the flow of electrons along the interconnect 418 and/or may have a negative impact on the long-term reliability of the microelectronic device.

Current conductive material deposition techniques are non-selective, relatively costly, and are susceptible to voiding, particularly with final opening after multi layer in the trenches or vias having widths of between about 2 and 15 nanometers with aspect ratios of between about 1 and 15. Additionally, using electroplating techniques in the filling of openings may also have issues with regard to metal corrosion due to long nucleation times, as well as bath stability and particle generation, as will be understood to those skilled in the art. Additionally, currently a thick copper seed layer (>300 angstrom) is used for electroplating. Such thick seed layer causes neck formation or pinch off at the entrance of the opening and tend to cause more voids to form in the opening as it is being filled with material.

Also it is to be noted that in the current practice, electroless technique can be used as only to deposit seed layer on the conductive barrier and subsequent filling can be done with electroplating technique. Doing so narrow trenches, i.e., final trench opening after multi or single layer barrier film, gets pinched off.

Therefore, it would be advantageous to develop techniques to effectively fill openings, while reducing or substantially eliminating void formation during the fabrication of interconnects for microelectronic devices.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
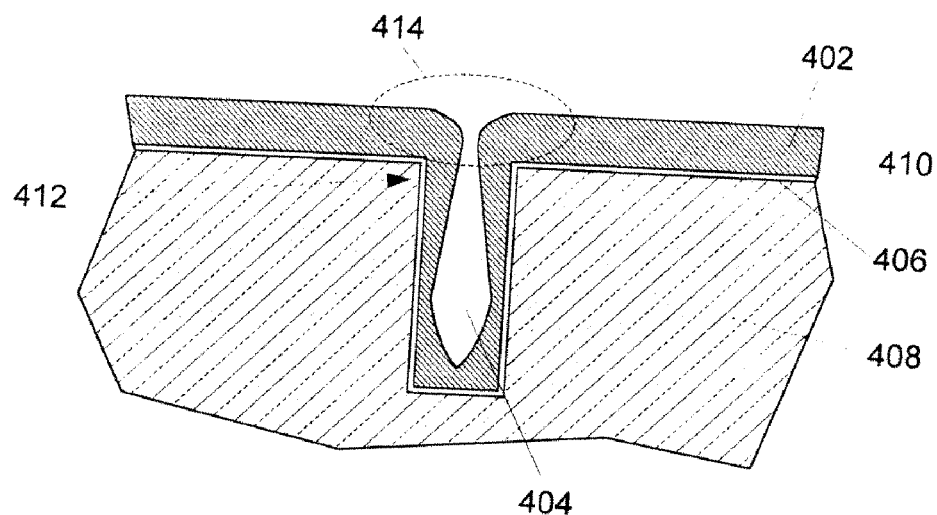
FIG. 1 illustrates a side cross-sectional view of a high aspect ratio opening having a build-up of conductive material at the mouth of an opening in a dielectric material during deposition of the conductive material, as known in the art.
Figure 2:
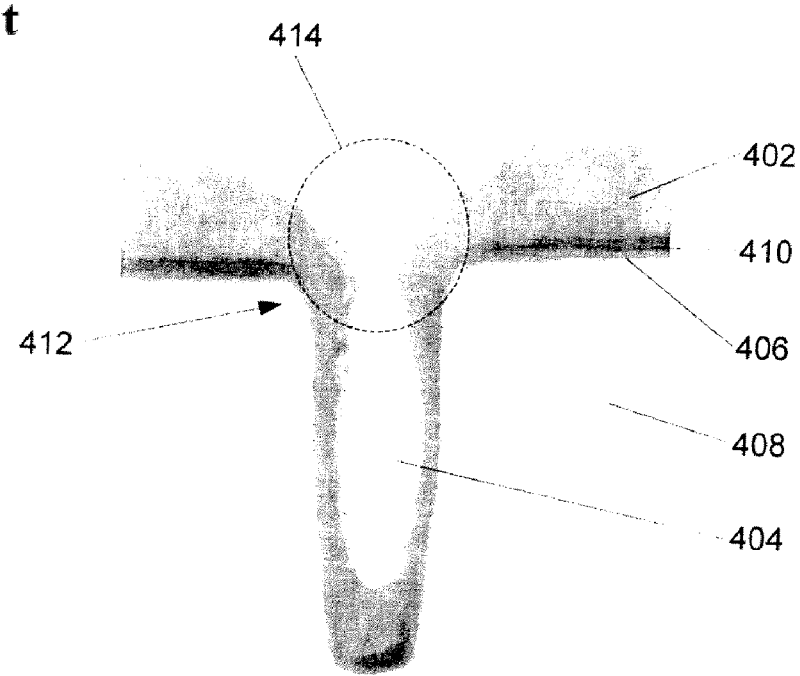
FIG. 2 is a micrograph showing the build-up of conductive material as illustrated in FIG. 1, as known in the art.
Figure 3:
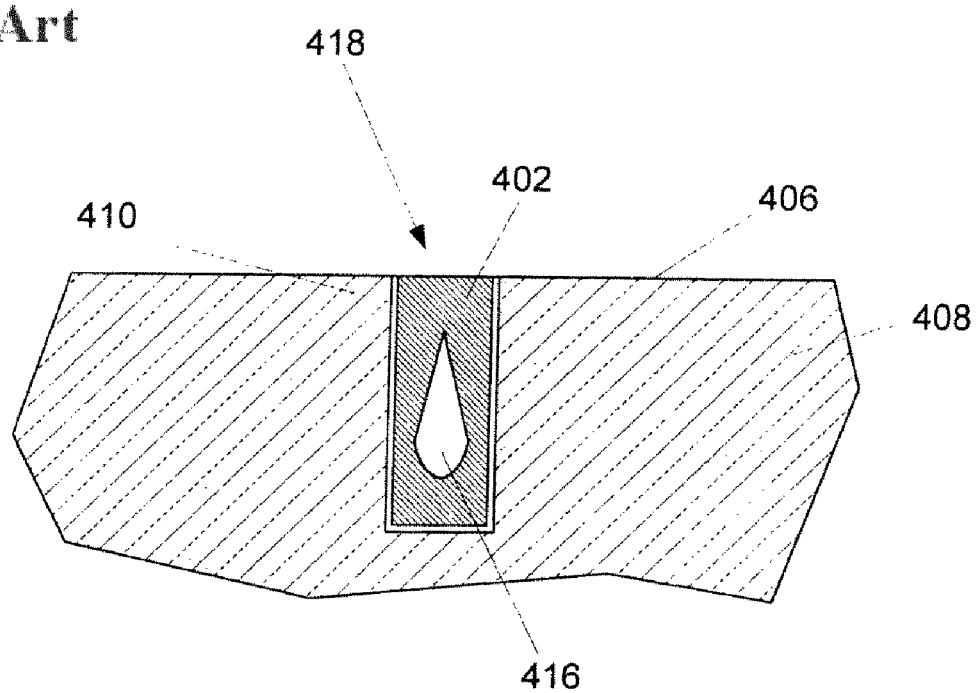
FIG. 3 illustrates a side cross-sectional view of a void within an interconnect, as known in the art.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Embodiments of the present invention relate to the fabrication of interconnect structures in microelectronic devices. The interconnect structures are fabricated by forming at least one opening in (e.g., a trench or via) a dielectric material and filling the opening(s) utilizing electroless deposition.

Figure 4:
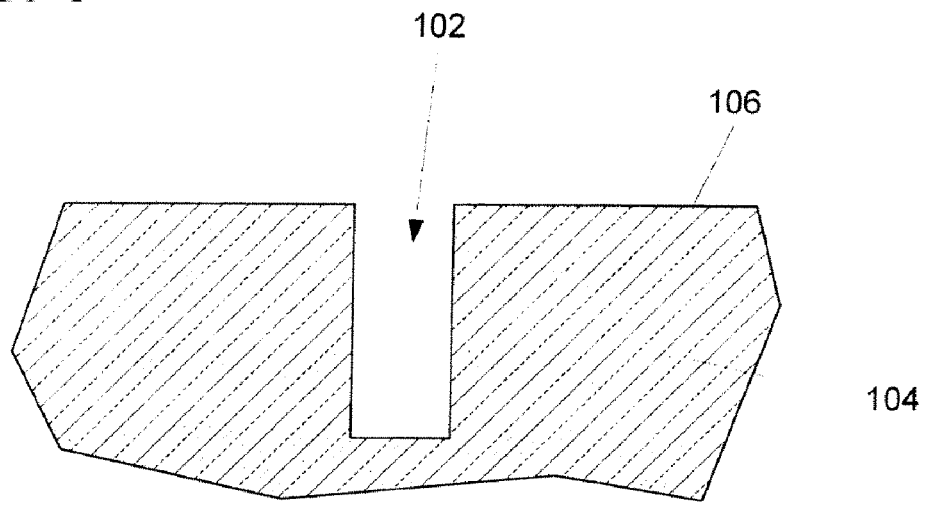
FIG. 4 illustrates a side cross-sectional view of an opening formed in a dielectric material, according to the present invention.

In one embodiment of the present invention as shown in FIG. 4, an opening 102 is formed in a dielectric material layer 104, extending into the dielectric material layer 104 from a first surface 106 thereof. The dielectric material layer 104 may include, but is not limited to, silicon oxide, silicon nitride, carbon doped oxide, fluorinated silicon oxide, boron/phosphorous doped oxide, and the like. The opening 102 may be formed by any technique known in the art, including but not limited to, lithography, ion milling, laser ablation, and the like. As shown in the FIG. 5, a barrier material layer 108 is deposited in the opening 102 to substantially and conformally abut (on top of) the dielectric material layer 104. Such, barrier material layers 108 are used when a material which will be subsequently deposited in the opening 102 is susceptible to diffusion into the dielectric material layer 104, such as copper, aluminum, silver, gold and their alloys. Such diffusion can adversely affect the quality of microelectronic device through increased leakage current and/or decreased reliability between interconnects.

The barrier layer 108 is thin and in one embodiment, less than 100 Å. In other embodiments, barrier layer 108 is less than 20 Å, less than 15 Å, and even less than 10 Å along the sidewalls of the opening 102 and optionally, along all surfaces of the opening 102. In one embodiment, the barrier layer 108 is made of a material that can both act as a diffusion barrier for the interconnect material (such as acting as a diffusion barrier for copper and copper alloys) and act as an activation layer for the interconnect material to form thereon. The barrier layer 108 is capable of being an activation layer by inherently providing nucleation sites for electroless plating without the need for activation and sensitization treatment. For example, in many applications, a conventional barrier layer is used and needs to be treated with a tin chloride acidic solution to sensitize the barrier layer then activated with a palladium or silver containing chemistries to allow for deposition of a conductive material such as copper. The barrier layer 108 of the present embodiment is capable of being an activation layer without such activation treatments. The barrier layer 108 is thus referred to as a "dual-function barrier."

Materials that can be used as a barrier layer that is both a diffusion layer and an activation layer include a Nobel metal alloy such as ruthenium (Ru) alloy, paladium (Pd) alloy, rhodium (Rh) alloy, nickel (Ni) alloy, iron (Fe) alloy, cobalt (Co) alloy, osmium (Os) alloy, iridium (Ir) alloy, and platinum (Pt) alloy, binary or tertiary alloys of any Nobel metal alloy such as RuTa alloy, NiCo alloy, RuW alloy, and RuTaW alloy, PtTa alloy, PtTaW alloy, etc.

A barrier layer 108 that can act as both a diffusion barrier and a nucleation layer will promote deposition of a conductive material such as electroless plating of copper without the need to have a separate process that can activate the diffusion layer. Thus, when such a dual function barrier layer is used, there may be no need of a seed layer such as a copper seed layer to be formed prior to the deposition of copper material. Also, when a dual function barrier layer is used, the barrier layer needs not be subjected to a separate process to activate the layer so as to make it act as a nucleation site for the deposition of material such as copper. In the present embodiment, the electroless plating process can immediately follow the barrier layer 108 formation.

A typical material can also be used for the barrier material layer 108, particularly for copper interconnects, may also include tantalum (Ta), TaN, titanium (Ti), tungsten (W), ruthenium (Ru), molybdenum (Mo), niobium (Nb), platinum (Pt), palladium (Pd), rhenium (Re), osmium (Os), iridium (Ir), gold (Au), rhodium (Rh), and the like, as well as nitrides, oxides, and alloys thereof. A portion of the barrier material layer 108 may also extend over and abut the dielectric material first surface 106. In many embodiments, an ultra-thin seed layer may be formed on top of the barrier layer 108.

Figure 6:
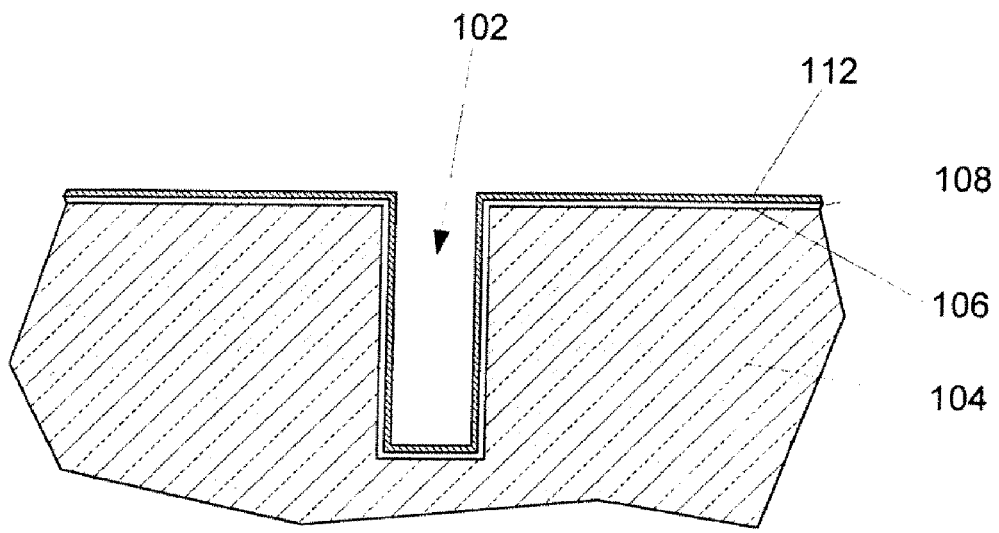
FIG. 6 illustrates a side cross-sectional view of an optional ultra-thin seed layer abutting the optional barrier material of FIG. 5, according to the present invention.

As shown in FIG. 6, an ultra-thin seed material 112 may be deposited on the barrier and can have a thickness of less than 20 Å, optimally, less than 15 Å, and even less than 10 Å along the sidewalls of the opening 102 (and on top of the barrier layer 108) and optionally, along all surfaces of the barrier layer 108 that reside within the opening 102. The seed material 112 may be deposited in a chemical vapor deposition (CVD) process, an atomic layer deposition (ALD) process, an electroless deposition or a physical vapor deposition (PVD) process, such as magnetron sputtering, but is not so limited. The seed material 112 provides a nucleation site for a subsequent electroless plating process. The seed material 112 may include, but is not limited to, copper (Cu), palladium (Pd), cobalt (Co), nickel (Ni), ruthenium (Ru), platinum (Pt), alloys thereof, and the like. In one embodiment, the solution used to deposit the seed material 112 may comprise palladium chloride or silver chloride (less than about 5 gm/liter), ethylenediamine tetraacetic acid (less than about 3 gm/liter, hydrochloric acid (about 37 wt. percent), glacial acetic acid (less than about 100 ml/liter), and the balance de-ionized water. The process selected to deposit the seed material 112 is chosen so that the ultra-thin film is formed. A relatively thick seed layer may prevent electroless process from filling or uniformly filling the opening 102 since a relatively thick seed layer tends to leave a small entrance into the opening 102. Corners of the opening are thus more likely to be covered with the seed material thicker than desired. To enhance uniform filling of the opening 102 and produces cleaner and sharper structures, the seed layer 112 is optimally as thin as possible. The growth of the seed layer 112 is also controlled (e.g., with a nucleation time less than 3 minutes) so that the material can uniformly form and line the opening 102.

Figure 5:
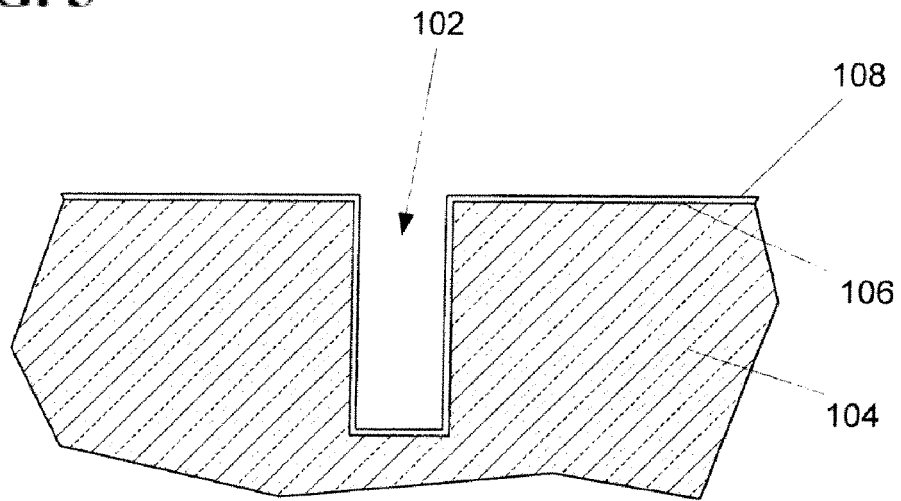
FIG. 5 illustrates a side cross-sectional view of an ultra-thin barrier material lining the opening of FIG. 1, according to the present invention.
Figure 7:
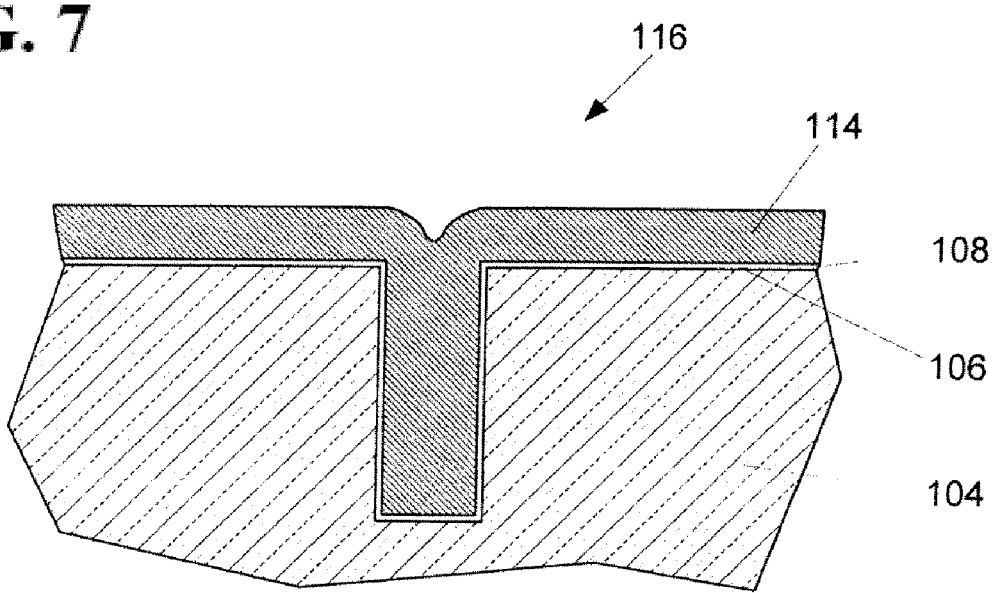
FIG. 7 illustrates a side cross-sectional view of the opening of FIG. 6 filled with a conductive material by an electroless plating process, according to the present invention.

As shown in FIG. 7, a conductive material layer 114 is electrolessly deposited within the opening 102 (see FIGS. 4-6). The electroless deposition process may include any autocatalytic (e.g., no external power supply is applied) deposition of the conductive material layer 114 through the interaction of a metal salt and a chemical reducing agent. As is known in the art, preparing or treating a surface, may be necessary in order to produce an activated surface so that the surface that is receptive to the electroless deposition process. Alternatively, as mentioned, using a dual-function barrier layer 109 can allow electroless plating process to follow immediately without the need for activating the surface of the barrier layer 108.

In one embodiment, during the electroless deposition, the seed material 112 serves as the activated surface upon which the electroless deposition forms. The seed material 112 also acts as a region which controls the placement of the deposited conductive material layer 114, because the conductive material layer 114 from the electroless deposition solution only deposits on the prepared or treated surface (i.e., the seed material 112). Similar to the seed material 112, the proposed new barrier material 108 can also act as a region which controls the placement of the deposited conductive material layer 114, because the conductive material layer 114 from the electroless deposition solution only deposits on the activation site (e.g., the barrier material 108). The inherent selectivity of the electroless deposition method not only results in a substantially void free material, but also results in a higher quality conductive material layer 114 because it improves the uniformity and continuity of the electrolessly deposited conductive material layer 114.

In one embodiment, the electroless plating bath or deposition solution may comprise cobalt and alloys thereof (such as cobalt alloyed with tungsten, boron, phosphorus, molybdenum, and/or the like), nickel and alloys thereof (such as nickel alloyed with tungsten, boron, phosphorus, molybdenum, and/or the like), copper, palladium, silver, gold, platinum metals and their selective alloys to fill narrow and high aspect ratio trenches and via holes. It is, of course, understood that the electroless deposition solution may also include additives (such as suppressors, polyethylene glycol, and anti-suppressors, di-sulfide) and complexing agents (such as thiosulfate and peroxodisulfate). Although a few examples of materials that may comprise the electroless deposition solution are described here, the solution may comprise other materials that serve to deposit the conductive material electrolessly. The technique of electrolessly depositing a metal or metal alloy is known to those skilled in the art, and may be performed either by immersing the substrate in an electroless deposition solution, by semi-immersion, or by spraying the electroless deposition solution onto the substrate or target (e.g., the dielectric material layer 104). It is well known to those skilled in the art that the seed material 112 may be subsumed during the electroless deposition process, such that the seed material 112 may become continuous with the conductive material layer 114, as depicted in FIG. 7.

In one embodiment, the electroless plating bath includes water, a water soluble compound containing the metal to be deposited (e.g., a metal salt), a complexing agent (e.g., an organic acid or amine) that prevents chemical reduction of the metal ions in solution while permitting selective chemical reduction on a surface of the target, and a chemical reducing agent for the metal ions (e.g., hypophosphite, dimethylaminoborane (DMAB), formaldehyde, hydrazine, or borohydride). Additionally, the plating bath may include a buffer (e.g., boric acid, an organic acid, or an amine) for controlling pH and various optional additives, such as bath stabilizers (e.g., pyridine, thiourea, or molybdates), surfactants (e.g., a glycol), and wetting agents. It is to be understood that the composition of a plating bath will vary depending on the desired plating outcome.

In one embodiment, the electroless plating bath includes, but is not limited to, water, a water-soluble copper-containing compound, a buffering agent, at least two reducing agents, a grain refining additive, a bath stabilizing agent, and a rate controlling additive.

A water-soluble copper-containing compound may be added to the water. The water-soluble copper-containing compound may be may be a copper salt. For example, in some implementations the copper salt may be cupric sulfate (e.g., $CuSO_4$), and in other implementations the copper salt may be copper chloride (e.g., $CuCl_2$). The copper salt provides the copper that will be deposited onto the substrate by the electroless plating process. As will be appreciated by those of skill in the art, alternate copper salts not mentioned here may be used as well. Once added to the water, the copper salt, such as copper sulfate or copper chloride, may have a concentration that is between 0.5 gram/liter (g/L) and 50 g/L in the electroless plating bath of the invention (e.g., $CuSO_4.5H_2O$, 0.5-50 g/L).

A buffering agent may be added to the water. In implementations of the invention, the buffering agent may consist of one or more compounds that are well known in the art as buffers for electroless plating baths. For instance, in implementations of the invention, buffering agents that may be used in the bath include, but are not limited to, ethylene diamine tetraacetic acid (EDTA), hydroxyethylene diamine triacetic acid (HEDTA), Rochelle salt (also known as potassium sodium tartarate), an organic acid (e.g., citric acid, tartaric acid, etc.), ammonium citrate, lactate, triethanolamine (TEA), and ethylene diamine. As will be appreciated by those of skill in the art, alternate buffering agents not mentioned here may be used as well. Once added to the water, the buffering agent may have a concentration that is between 25 g/L and 100 g/L in the electroless plating bath of the invention. In general, the concentration of buffering agent will be directly proportional to the concentration of the copper-containing compound.

In accordance with an implementation of the invention, a dual reducing agent formulation may be used in the electroless plating bath. One reducing agent that is added to the water may consist of a bulk reducing agent that is stable and relatively inexpensive. The bulk reducing agent makes up the majority of the reducing agent that is added to the electroless plating bath and may or may not be able adequately initiate the reducing chemistry. The other reducing agent that is added to the water may consist of a catalyst reducing agent that is capable of adequately initiating the reducing chemistry. A relatively small amount of the catalyst reducing agent is used as the catalyst reducing agent tends to be relatively expensive. Once the reducing chemistry is initiated, the process becomes self-activated. The catalyst reducing agent and the bulk reducing agent may be added simultaneously or separately.

In some implementations, a combination of glycolic acid and glyoxylic acid may be used. Glycolic acid may be used as the bulk reducing agent, however, glycolic acid cannot be used as the sole reducing agent because it cannot adequately initiate the reducing chemistry. Therefore, a minimal amount of a catalyst reducing agent, such as glyoxylic acid, is used to initiate the reducing chemistry. In some implementations, the glyoxylic acid may be added to the water in a monohydrate form. In alternate implementations, the glyoxylic acid may be added to the water in the form of a solution, for example, as a 50% solution of glyoxylic acid.

In some implementations, the glycolic acid may constitute 95% to 99% of the reducing agent in the plating bath of the invention, while the glyoxylic acid may constitute the remaining 1% to 5% of the reducing agent. In some implementations, the total reducing agent may have a concentration that is between 2.5 g/L and 30 g/L in the electroless plating bath of the invention. Therefore, the glycolic acid content of the reducing agent may range from approximately 2.37 g/L to approximately 29.7 g/L. Similarly, the glyoxylic acid content of the reducing agent may range from approximately 0.02 g/L to approximately 1.5 g/L. As will be recognized by one of ordinary skill in the art, the amount of glyoxylic acid used in the electroless plating bath of the invention is substantially lower than the amount used in conventional plating baths.

In another implementation of the invention, the reducing agent may consist of a combination of a hypophosphite and glyoxylic acid. Similar to the glycolic acid, the hypophosphite can function as the reducing agent but cannot adequately initiate the reducing chemistry. Therefore, a catalyst reducing agent, such as glyoxylic acid, is needed. Examples of hypophosphites that may be used include, but are not limited to, sodium hypophosphite and ammonium hypophosphite. Like glycolic acid, hypophosphites cannot be used as the sole reducing agent, therefore, a minimal amount of glyoxylic acid is used in combination with the hypophosphites. In some implementations, the hypophosphite may constitute 95% to 99% of the reducing agent in the plating bath of the invention, while the glyoxylic acid may constitute the remaining 1% to 5% of the reducing agent. The total reducing agent may have a concentration that is between 5 g/L and 30 g/L in the electroless plating bath of the invention. Therefore, the hypophosphite content of the reducing agent may range from approximately 2.37 g/L to approximately 29.7 g/L. Similarly, the glyoxylic acid content of the reducing agent may range from approximately 0.02 g/L to approximately 1.5 g/L.

In alternate implementations of the invention, the glyoxylic acid may be replaced with alternate reducing agents that may be used in combination with glycolic acid or hypophosphite. Examples of glyoxylic acid replacements in the electroless plating bath of the invention include, but are not limited to, DMAB, hydrazine, borohydride, as well as any other well known metal reducing agent. As will be appreciated by those of skill in the art, alternate reducing agents not mentioned here may be used with the glycolic acid or the hypophosphite.

A grain refining additive may be added to the water. In implementations of the invention, the grain refining additive may be a high molecular weight compound that is capable of reducing the grain size of the plated copper metal. In implementations of the invention, materials that may be used as the grain refining additive include, but are not limited to, polyethylene glycol (PEG), ethylene diamine, propionitrile (also known as ethyl cyanide), and ethylene glycol (EG). Some of these materials may be available in polymeric form, such as PEG which may be available as PEG 2000, PEG 4000, PEG 6000, etc. In accordance with implementations of the invention, the grain refining additive may have a molecular weight that ranges from 1,000 to 10,000. As will be appreciated by those of skill in the art, alternative high molecular weight compounds capable of reducing the grain size of the plated copper metal may be used. Once added to the water, the grain refining additive may have a concentration that is between 0.25 g/L and 5.0 g/L.

A bath stabilizing agent may be added to the water. In implementations of the invention, the bath stabilizing agent may consist of one or more compounds that are capable of stabilizing the bath against the formation of undesired cuprous oxide particles for electroless plating processes. In some implementations, the bath stabilizing agent may further function as a leveling agent to produce mirror-like plated surfaces. In implementations of the invention, bath stabilizing agents that may be used include, but are not limited to, thiourea, dypiridil, mercaptobenzothiazole (MBT), benzotriazole, Janus Green B (JGB), cyanide, vanadium pentoxide ($V_2O_5$), as well as certain high molecular weight polymers. Once added to the water, the bath stabilizing agent may have a concentration that is between 0.02 g/L and 0.1 g/L. In alternate implementations, aeration may be used as a stabilizer.

A rate controlling additive may be added to the water. In implementations of the invention, the rate controlling additive may consist of one or more compounds that are capable of suppressing the deposition rate of copper metal in certain portions of the substrate while increasing the deposition rate of the copper metal in other portions of the substrate. This may be necessary to fill high aspect ratio features. For example, a bottom-up fill process (also known as superfill) may be used to fill high-aspect features by suppressing the copper deposition rate at the surface of the substrate (often referred to as the "field"), while simultaneously increasing the copper deposition rate within the narrow trenches and vias. Once added to the water, the rate controlling additive may have a concentration that is between 0.01 g/L and 0.5 g/L.

In some implementations, certain rate controlling additives may function to both increases the copper deposition rate within the features while suppressing the copper deposition rate on the field. For instance, certain polymeric additives, such as PEG, may become anchored to the field by techniques that are well known in the art, such as the use of a metal catalyst as an anchoring agent. The anchored polymeric additive substantially prevents copper from depositing on at least portions of the field, thereby suppressing the copper deposition rate at the surface of the substrate. Suppressing metal deposition on the field forces the metal to travel down into the narrow trenches where the metal deposits and fills the gap. The polymeric additive generally does not inhibit metal deposition within the features, such as the narrow trenches and vias, because the size of the high molecular weight polymer substantially prevents it from entering such features. The polymeric additive therefore increases copper deposition within the features by suppressing copper deposition on the top surface.

In some implementations, certain rate controlling additives may be used to suppress the copper deposition rate in areas while other rate controlling additives may be used to increase the copper deposition rate in other areas. For instance, rate controlling additives that may be used to suppress the copper deposition rate on the field include, but are not limited to, polyethers such as polyethylene glycol (PEG), polypropylene glycol (PPG), nitrogen bearing heterocyclic or non-heterocyclic aromatic compounds, large molecular weight polyoxyalkyl type compounds, and other high molecular weight polymers. Furthermore, rate controlling additives that may be used primarily to increase the copper deposition rate within high-aspect features include, but are not limited to, sulfur-based organic molecules such as bis(sodiumsulfopropyl) disulfide (SPS), other disulfides, and surfactants.

In addition to promoting superfill, the use of rate controlling additives allows the nucleation time to be controlled without having to rely on adjustments to the pH level and/or temperature of the electroless plating bath, as is done in conventional processes. Furthermore, the use of rate controlling additives allows the nucleation time to be varied across the different areas of the substrate (i.e., suppressing the deposition rate on the field while increasing the deposition rate within the features), which cannot be readily accomplished by adjusting the pH level and temperature of the bath. Finally, the use of rate controlling additives enables the electroless plating bath of the invention to be used over a wider pH range and a wider temperature range than conventional processes. For instance, in some implementations, the electroless plating bath described herein may be used within a pH range of pH 9 to pH 14 and a temperature range of 50° C. to 80° C. As will be appreciated by those of skill in the art, alternate rate controlling additives not mentioned here may be used as well. In one embodiment, the nucleation process is controlled to be between 1.5-3.5 minutes, or optionally, 2-3 minutes.

Furthermore, implementations of the invention described herein provide electroless plating baths that may be used over a wider pH range and temperature range relative to conventional electroless plating baths. As described above, the electroless plating baths described herein may be used within a pH range of pH 9 to pH 14 and a temperature range of 50° C. to 80° C.

Embodiments of the present invention can be used to fill an opening without forming any neck during deposition (and consequentially virtually no voids in the interconnects) for a variety of aspect ratios, low (equal to or less than 1) or high (greater than 1). Furthermore, it will be apparent that the present invention can be utilized in a variety of fabrication processes including the manufacturing of nano-scale devices and microelectronic machines.

In a specific illustration of an embodiment of the present invention, the seed material or barrier material layer is cleaned with a mild acidic etchant at a pH of between about 0 and 5 and a temperature of between about 25 band 50 degrees Celsius to remove any contaminants before the electroless plating process. Each of these steps may be performed with minimum exposure to air or oxygen, without exposure to air, or more specific without exposure to oxygen (i.e., in inert/non-oxidizing controlled environment, such as nitrogen, helium, argon, or forming gas) to prevent oxidation of the metal or alloy substrate.

It is, of course, understood that the electroless deposition apparatus may include variety of components and may include, but is not limited to, an integrated mega/ultra sonic, brush cleaning station and SRD (spin and rinse dryer) for cleaning and/or drying, an electroless deposition chamber (single wafer or batch, wafer face up or face down with spray or immersion or spin-on deposition methods), a wafer handling module, chemical delivery/distribution with recirculation module for electroless plating chemistries and cleaning chemistries, and an inert heating chamber for annealing from room to 600 degree Celsius.

Figure 8:
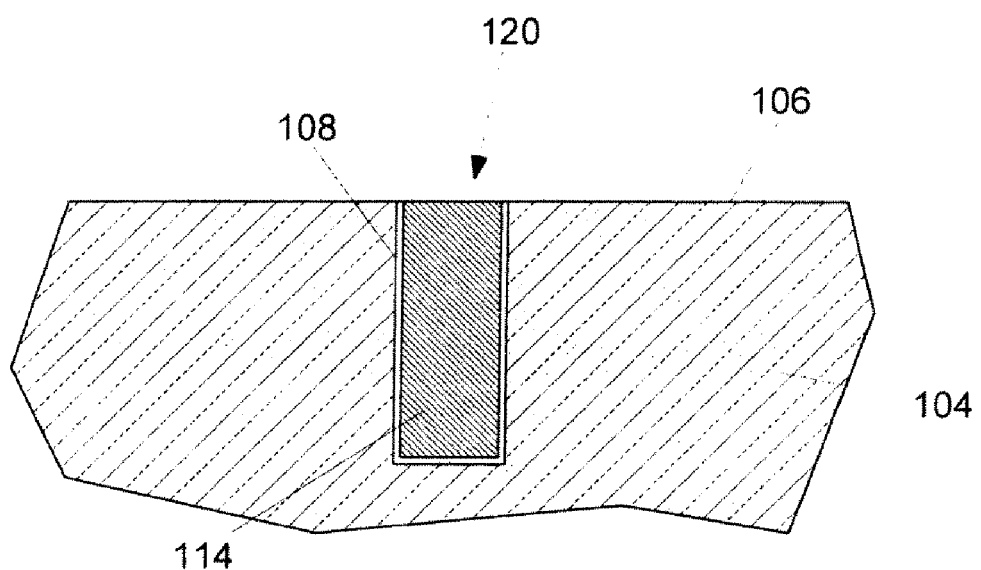
FIG. 8 illustrates a side cross-sectional view of an interconnect formed after removing excess conductive material of FIG. 7 which does not reside within the filled opening, according to the present invention.
Figure 9:
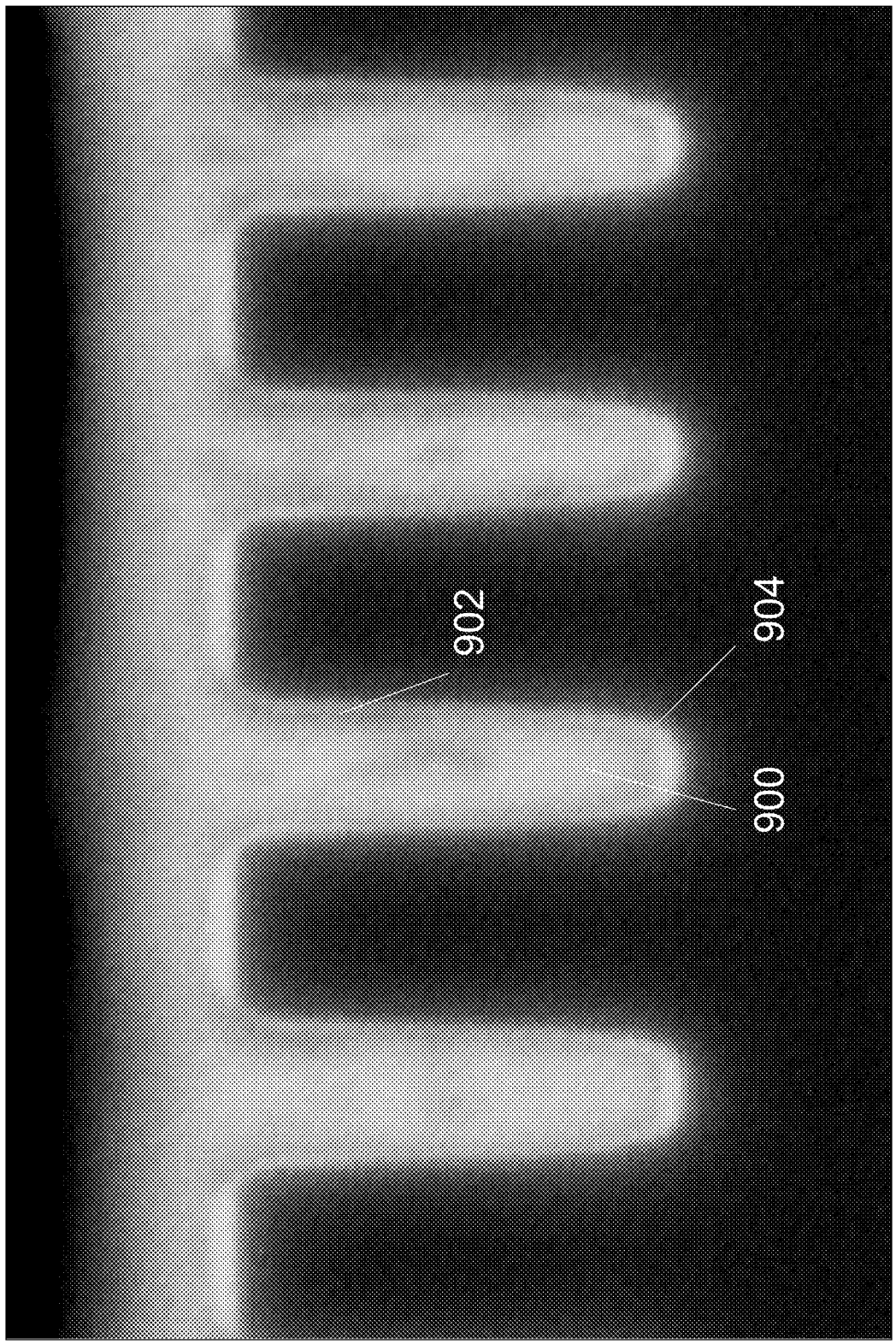
FIG. 9 is a micrograph showing filled openings having an aspect ratio of greater than about 5, according to the present invention.

As shown in FIG. 8, the resulting structure 116 of FIG. 7 is planarized, usually by a technique called chemical mechanical polish (CMP) or by an etching process, which removes the conductive material layer 114, which is not within the opening 102 (see FIGS. 4-6), from the dielectric material first surface 106 to form an interconnect 120. FIG. 9 is a cross-sectional micrograph illustrating an opening 900 having an aspect ratio of greater than about 5, filled with copper and lined with an ultra-thin seed layer 902 and a thin barrier layer 904 (not clearly visible), prior to planarization according to the present invention. As can be seen, at the entrance of the opening 900, there is no overhang and no voids are seen in the opening 900.

Figure 10:
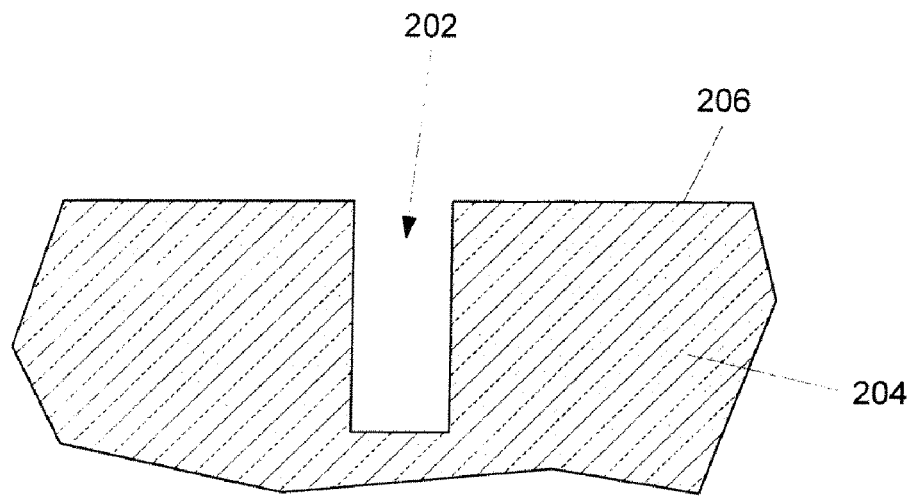
FIGS. 10-13 illustrate side cross-sectional views of forming an interconnect without the use of a seed layer, according to the present invention.
Figure 11:
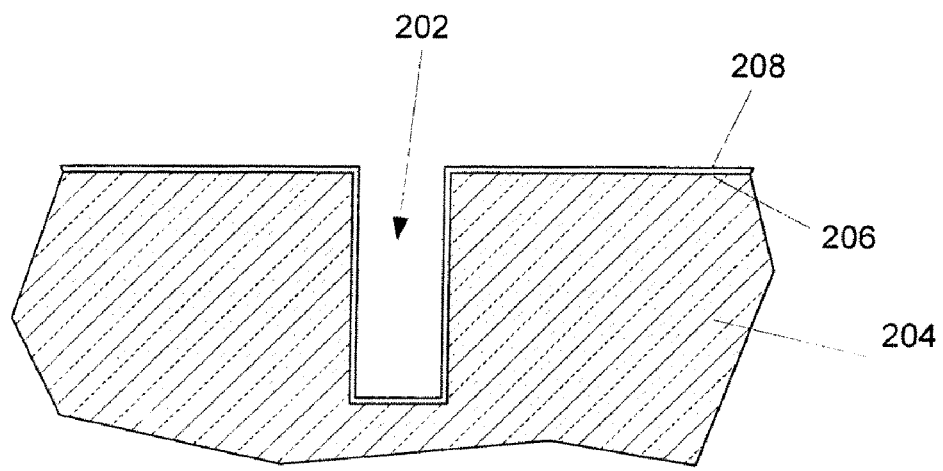

In another embodiment of the present invention, shown in FIGS. 10-13, the conductive material layer may be formed directly on a dual-function barrier layer that performs as a diffusion barrier layer and a nucleation layer as previously discussed. As shown in FIG. 10, an opening 202 is formed in a dielectric material layer 204, extending into the dielectric material layer 204 from a first surface 206 thereof. As shown in the FIG. 11, a dual-function barrier material 208 is formed in the opening 202 substantially and conformally abut (or on top of) the dielectric material layer 204.

The dual-function material 208 may be formed by depositing a Nobel metal alloy of a binary or tertiary order, less than about 20 Å, 15 Å, or even less than 10 Å thick deposited by physical vapor deposition, atomic layer deposition, CVD or electroless deposition. The dual-function barrier material 208 may be, in one embodiment, pre-cleaned or treated with a acidic etchant with a pH between about 3-5 and may be applied from about 20 to 60 degrees Celsius to remove native oxides or any contaminants.

Figure 12:
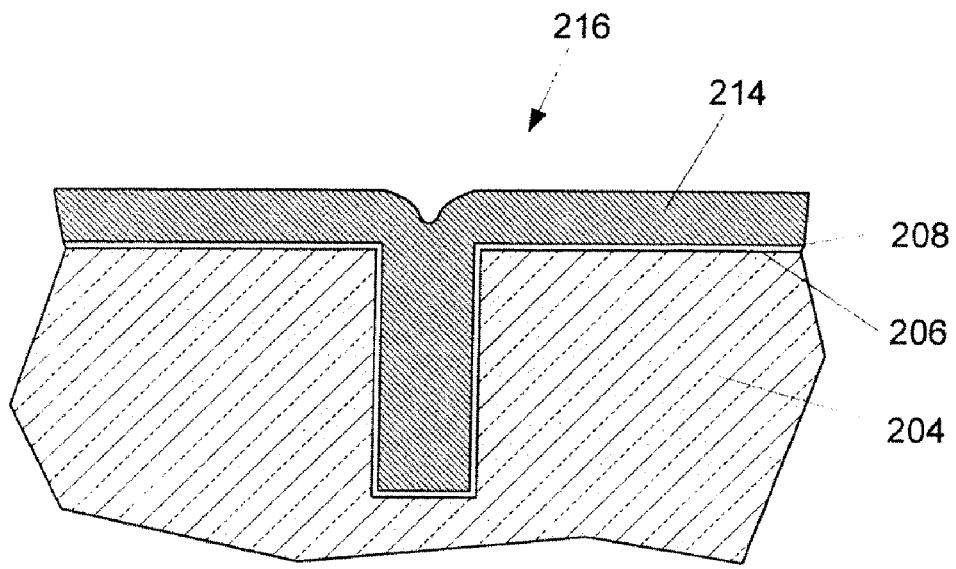
Figure 13:
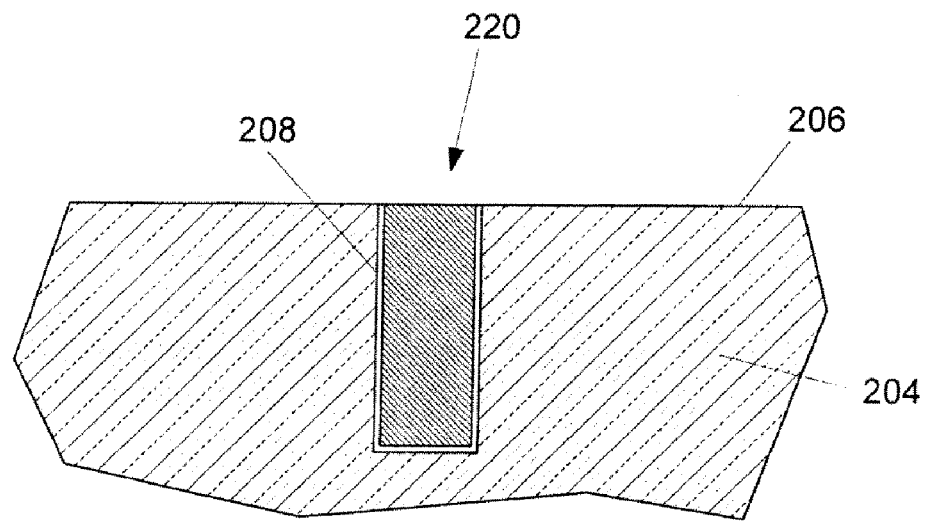

As shown in FIG. 12, a conductive material layer 214 is electrolessly deposited within the opening 202 (see FIGS. 10-13) in a manner discussed in previous embodiments. During the electroless deposition, the dual-function barrier material 208 serves as the nucleated site or surface upon which the electroless deposition forms.

Although the description of the present invention is primarily focused on forming an interconnect with metals and their alloys, the teachings and principles of the present invention are not so limited and can be applied to any material (including plastics), any metal compounds or alloys, to any barrier materials, to nanotech devices, and the like, as will be understood to those skilled in the art. It is also understood that the present invention may be used at any metallization/interconnect layer in the fabrication of a microelectronic device.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating an interconnect, comprising:
providing a dielectric material layer having an opening extending into said dielectric material from a first surface thereof;
forming a barrier material layer within said opening; and
forming an ultra-thin seed layer having a thickness less than 20 Å on top of said barrier material layer; and
electrolessly depositing a conductive material within said opening using an electroless plating solution including glyoxylic acid and glycolic acid;
wherein the weight ratio of glyoxylic acid to glycolic acid is 1-5% glyoxylic acid to 95-99% glycolic acid.

2. The method of claim 1, wherein said barrier material layer has a thickness less than 20 Å.

3. The method of claim 1, wherein said barrier material layer is capable of acting as a diffusion barrier layer and a nucleation surface for a conductive material comprises a noble metal alloy.

4. The method of claim 1, wherein said conductive material is selected from a group consisting of cobalt, nickel, copper, palladium, silver, gold, platinum, and alloys thereof.

5. The method of claim 1 further comprises, controlling a nucleation time for said electrolessly deposition of said conductive material.

6. The method of claim 1, wherein said barrier material layer comprises Ta, TaN, alloys of Ta or nitrides thereof.

7. The method of claim 1, wherein said electroless plating solution further comprises, water; a water-soluble copper-containing compound, a buffering agent, a grain refining additive, a bath stabilizing agent, and a rate controlling additive.

8. The method of claim 7 wherein the water-soluble copper-containing compound comprises at least one compound selected from the group consisting of cupric sulfate and copper chloride.

9. The method of claim 7, wherein the grain refining additive comprises at least one chemical selected from the group consisting of PEG, ethylene diamine, propionitrile, and ethylene glycol.

10. The method of claim 7, wherein the bath stabilizing agent comprises at least one chemical selected from the group consisting of thiourea, dypiridil, MBT, benzotriazole, JGB, cyanide, and V2O5.

11. The method of claim 7, wherein the rate controlling additive comprises at least one chemical selected from the group consisting of polyethers, PEG, PPG, nitrogen bearing heterocyclic aromatic compounds, nitrogen bearing non-heterocyclic aromatic compounds, large molecular weight polyoxy-alkyl type compounds, high molecular weight polymers, sulfur-based organic molecules, SPS, disulfides, and surfactants.

* * * * *